United States Patent
Seitz

(10) Patent No.: US 8,299,504 B2
(45) Date of Patent: Oct. 30, 2012

(54) IMAGE SENSING DEVICE AND METHOD OF

(75) Inventor: Peter Seitz, Urdorf (CH)

(73) Assignee: MESA Imaging AG, Zurich (CH)

( * ) Notice: Subject to any disclaimer, the term of this patent is extended or adjusted under 35 U.S.C. 154(b) by 0 days.

(21) Appl. No.: 12/355,832

(22) Filed: Jan. 19, 2009

(65) Prior Publication Data

US 2009/0121308 A1   May 14, 2009

Related U.S. Application Data

(63) Continuation of application No. 10/518,963, filed as application No. PCT/GB03/02434 on Jun. 5, 2003, now Pat. No. 7,498,621.

(30) Foreign Application Priority Data

Jun. 20, 2002 (GB) .................................. 0214257.8

(51) Int. Cl.
*H01L 27/148* (2006.01)
(52) U.S. Cl. . 257/222; 257/290; 257/384; 257/E31.064; 348/48; 348/284
(58) Field of Classification Search .................. 257/225, 257/231, 431, 461, E31.053, E31.054, E31.073; 348/294, 297
See application file for complete search history.

(56) References Cited

U.S. PATENT DOCUMENTS

| | | | |
|---|---|---|---|
| 3,714,522 A * | 1/1973 | Komiya et al. | 359/321 |
| 4,245,233 A | 1/1981 | Lohstroh | |
| 4,388,532 A * | 6/1983 | Garcia | 250/208.1 |
| 4,885,620 A | 12/1989 | Kemmer et al. | |
| 4,951,106 A | 8/1990 | Blouke | |
| 5,028,554 A * | 7/1991 | Kita | 438/305 |
| 5,208,477 A | 5/1993 | Kub | |
| 5,528,643 A | 6/1996 | Hynecek | |

(Continued)

FOREIGN PATENT DOCUMENTS

DE   44 40 613 C1   7/1996

(Continued)

OTHER PUBLICATIONS

International Search Report, mailed Nov. 6, 2003, from International Application No. PCT/GB03/02434, filed Jun. 5, 2003.

(Continued)

*Primary Examiner* — Eduardo A Rodela
(74) *Attorney, Agent, or Firm* — Houston & Associates, LLP

(57) ABSTRACT

A two-dimensional, temporally modulated electromagnetic wavefield, preferably in the ultraviolet, visible or infrared spectral range, can be locally detected and demodulated with one or more sensing elements. Each sensing element consists of a resistive, transparent electrode (E) on top of an insulated layer (O) that is produced over a semiconducting substrate whose surface is electrically kept in depletion. The electrode (E) is connected with two or more contacts (C1; C2) to a number of clock voltages that are operated synchronously with the frequency of the modulated wavefield. In the electrode and in the semiconducting substrate lateral electric fields are created that separate and transport photogenerated charge pairs in the semiconductor to respective diffusions (D1; D2) close to the contacts (C1; C2). By repetitively storing and accumulating photocharges in the diffusions (D1; D2), electrical signals are generated that are subsequently read out for the determination of local phase shift, amplitude and offset of the modulated wavefield.

10 Claims, 4 Drawing Sheets

U.S. PATENT DOCUMENTS

| | | | |
|---|---|---|---|
| 5,856,667 A | 1/1999 | Spirig et al. | |
| 6,531,331 B1 * | 3/2003 | Bennett et al. | 438/48 |
| 6,777,659 B1 | 8/2004 | Schwarte | |
| 6,825,455 B1 | 11/2004 | Schwarte | |
| 7,268,815 B1 | 9/2007 | Meynants | |

FOREIGN PATENT DOCUMENTS

| | | |
|---|---|---|
| DE | 198 21 974 A1 | 11/1999 |
| EP | 0 435 509 A2 | 7/1991 |
| EP | 1 152 261 A1 | 11/2001 |
| JP | 57-136870 A | 8/1982 |

OTHER PUBLICATIONS

Lange, R. et al., "Solid-State Time-of-Flight Range Camera," IEEE Journal of Quantum Electronics, vol. 37, No. 3, Mar. 2001, pp. 390-397.

Theuwissen, A. J. P., "Solid State Imaging with Charge Coupled Devices," Kluwer Academic Publishers, Dordrecht, 1995, pp. 7-51.

* cited by examiner

IMAGE SENSING DEVICE AND METHOD OF

RELATED APPLICATIONS

This application is a Continuation of U.S. application Ser. No. 10/518,963, filed on Oct. 3, 2005, which is a 371 National Stage of PCT application serial number PCT/GB2003/02434, filed on Jun. 5, 2003, which in turn claims priority to United Kingdom Patent Application No. GB 0214257.8, filed on Jun. 20, 2002, all of which are incorporated herein by reference in their entirety.

FIELD OF THE INVENTION

The invention relates to an image sensor element. The invention further relates to a device for and a method of detection and demodulation of a modulated wavefield. The invention still further relates to a method of determining the three dimensional shape of a reflective object.

The present invention may be applied to all sensing and measuring techniques that require the sensitive local detection and demodulation of temporally modulated electromagnetic wavefields, preferably in the ultraviolet, visible or infrared spectral range. This capability is useful, in particular, for non-contact distance measurement techniques based on optical phase-shifting interferometry or on time-of-flight ranging. The present invention may be applied, in particular, to all sensing and measurement techniques that require dense one- or two-dimensional arrays of demodulation pixels.

BACKGROUND OF THE INVENTION

DE 44 40 613 C1 teaches the detection and demodulation of intensity modulated wavefields with sensing elements that consist of three parts: one photosensitive part, in which incident photons are converted into a proportional number of electronic charge pairs, one or more storage elements, into which the photogenerated charges are stored and accumulated and an equal number of switches between the photosensitive part and each storage element. The switches are operated synchronously with the modulation frequency. A preferred embodiment relies on charge coupled device (CCD) techniques, as described by A. J. P. Theuwissen in "Solid-state imaging with charge-coupled devices", Kluwer, Dordrecht, 1995. There the photosensitive site and the switches are realized and operated as CCD gates that transport the photo-generated charge laterally. Disadvantages of this approach include the limited demodulation speed that is obtained with CCDs, especially if large photosensitive sites and CCD gates are employed, the necessity for special semiconducting processes for the fabrication of the CCD structures, and the demands on clocking waveforms with specially shaped rising or falling edges in order to obtain a high charge transfer efficiency under the CCD gates.

An alternative embodiment of the switches employs field effect transistors. (FETs), as available in industry standard Complementary Metal Oxide Semiconductor (CMOS) processes. This type of switch is simpler to operate, and it is readily fabricated. The disadvantage of the FET switch is increased charge and voltage noise behaviour due to incomplete charge transfer, charge injection effects and channel current noise caused by gate voltage fluctuations.

DE 198 21 974 A1 claims to overcome the speed limitations of large photosensitive elements by replacing the single large photogate with a comb-like structure of interdigitated finger electrode photogates. The photogenerated charge carriers are therefore more rapidly collected, and they can also be transferred more quickly on two or more storage elements. This invention relies also on switching elements for transferring photocharge onto suitable storage elements. The disadvantages of these switching elements, realized as CCD gates or FETs, are the same as described for DE 44 40 613 C1.

EP 00109721 describes an alternative sensing element for the detection and demodulation of intensity modulated wavefields. It employs two photosensing parts per sensing element, each with two storage sites and associated switching element. When used in conjunction with a diffusing optical component on top of the sensing element for the equal distribution of the incoming wavefield intensity on the two photosites, this device allows prolonged integration times and relieves the timing restrictions on the clock waveform. The number of storage sites is limited to four, rendering this device ineffective if more than four samples per period of the modulated waveform should be taken. Since this invention also relies on switches for the transfer of photocharges from the photosites to the storage elements the same disadvantages are encountered as described for the above two inventions.

CH 3176/96 teaches the use of a resistive, elongated electrode with a static voltage difference at the two ends, as a means for photogenerating and transporting charge carriers with improved speed along one lateral direction. This is achieved with the static lateral electric field that is created parallel to the surface at the semiconductor-insulator interface. This lateral field moves photocharges significantly faster compared with a conventional CCD structure that has an electrode of the same size but not resorting to the lateral electrical field disclosed in this invention. Since photocharge can only be moved in one fixed direction, no demodulation action for an incident modulated wavefield can be obtained with such a device.

U.S. Pat. No. 5,528,643 describes even faster lateral transport of photogenerated charge carriers, by employing a series of CCD gates, each of which has contacts at both ends at which voltage differences can be applied. In this way, each CCD electrode exhibits a lateral drift field at the semiconductor-insulator interface. The object of the invention disclosed in U.S. Pat. No. 5,528,643 is the architecture of a two-dimensional CCD image sensor with improved photocharge transport speed in the column and read-out line directions. Since photocharge can only be moved in one fixed direction, no demodulation action for an incident modulated wavefield can be obtained with such a device.

SUMMARY OF THE INVENTION

One object of the invention is to provide a new optoelectronic sensing device for the local demodulation of a modulated electromagnetic wavefield, preferentially in the ultraviolet, the visible and the near infrared portion of the electromagnetic spectrum.

A further object of invention is to provide an architecture for geometrical arrangement of the sensing device in one or two dimensions for the realization of demodulation line and image sensors.

In a first aspect the invention provides an image sensor element comprising a semiconductor substrate, a radiation transparent insulating layer formed on the semiconductor substrate, an electrode formed as a layer of transparent resistive material on the insulating layer, a first contact adjacent to one edge of the resistive layer, a first diffusion-region in the semiconductor substrate of opposite conductivity to the semi-conductor substrate located adjacent to the first contact and biased to a higher potential than that of the first contact, a second diffusion region is the semiconductor substrate of opposite conductivity to the semiconductor substrate located adjacent to the second contact and biassed to a higher potential than that of the second contact, means for applying an electrical potential between the first and second contacts, and means for reading out the charge on the first and/or second diffusion regions.

Further preferred, advantageous, and alternative features of the image sensor element are disclosed and claimed in the dependent claims 2 to 14 to which reference should now be made.

Thus an image sensor element is provided that consists of a resistive, transparent electrode on top of an insulated layer that is produced over a semiconducting substrate whose surface is electrically kept in depletion. The electrode is provided with two or more contacts by which it may be connected to a number of clock voltages that are operated synchronously with the frequency of a modulated wavefield. In the electrode and in the semiconducting substrate lateral electric fields are created that separate and transport photogenerated charge pairs in the semiconductor to respective diffusions close to the contacts. By repetitively storing and accumulating photocharges in the diffusions, electrical signals may be generated that are subsequently read out for the determination of local phase shift, amplitude and offset of the modulated wavefield.

In a second aspect the invention provides a device for the detection and demodulation of a modulated wavefield comprising an image sensor consisting of a one or two dimensional array of image sensor elements, each image sensor element being an image sensor element according to the invention; a signal generator for supplying time dependant voltage patterns to the contacts on each of the image sensor element electrodes in synchronism with the modulation frequency of the incident wavefield to transport photocharges laterally to the corresponding diffusions on which photocharges are accumulated; and readout means for reading out the charges on the diffusions for use in calculating the modulation parameters of the incident modulated wavefield.

Further preferred, advantageous, and/or alternative features of the device for the detection and demodulation of a modulated wavefield are disclosed and claimed in dependant claims 16 to 18 to which reference should now be made.

The demodulation device according to the present invention mitigates disadvantages of the state of the art devices in several respects: the modulation and demodulation frequencies can be increased through the explicit use of lateral electric fields for the faster transport of photogenerated charge carriers to the storage sites. The device consists of only two elements: the contacted, resistive, transparent electrode and the charge storage sites, obviating the need for electronic switches. The device is therefore simpler to operate, since no timing and voltage shaping restrictions must be respected, in contrast to CCDs. For example; in its simplest realization, just one digital clock signal suffices for proper operation. The device is simple to fabricate by employing standard CMOS process technology since no overlapping polysilicon electrodes or buried channels as are required in contrast to certain CCDs.

In a third aspect the invention provides a method of detecting and demodulating modulated wavefields comprising the steps of:
a) illuminating the array of image sensing elements of a device for the detection and demodulation of a modulated wavefield according to the invention with the modulated wave field;
b) dividing each period of the modulation frequency into a number of intervals;
c) providing a separate contact and corresponding diffusion region for each time interval;
d) transporting photogenerated charge to the corresponding diffusion regions during each time interval and storing them therein;
e) reading out the stored charges from the diffusion regions; and
f) calculating demodulation parameters from the charges readout from the diffusion regions.

In a fourth aspect the invention provides a method of determining the three dimensional shape of reflective object comprising the steps of:
a) illuminating the object with a modulated light source;
b) imaging light reflected from the object onto an array of image sensor elements of a device for the detection and demodulation a modulated wafefield to form a two dimensional intensity modulated wavefield whose local phase represents local distance from the object to the detection device;
c) dividing each period of the modulation frequency into a number of time intervals;
d) providing a separate contact and corresponding diffusion region for each time interval;
e) transporting photoregenerated charge to the corresponding diffusion regions during each time interval and storing them therein;
f) reading out the stored charge from the diffusion regions;
g) calculating the local phase of the modulated wavefield incident on the array; and
h) using the local phase information to determine the three dimensional shape of the object.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The present invention makes use of semiconducting material such as silicon for the conversion of incident photons into electron-hole pairs. Without loss of generality, it is assumed in the following that this semiconducting material is p-doped, and that it is desired to detect electrons as minority charge carriers in the semiconducting material. All subsequent arguments can be suitably modified to hold true for the detection of photogenerated holes as minority carriers in n-doped semiconducting material.

The semiconducting material is covered with a transparent insulating layer, preferentially an oxide, as available in industry standard CMOS processes. The thickness of this insulator is preferably between 1 nm and 1 μm. Thinner insulators let a larger part of electric surface fields into the semiconductor but these thinner oxides are more difficult to fabricate. On top of the insulator an electrode surface is formed from a transparent, resistive material with an electrical sheet resistivity greater than 10 Ω/square. A preferred material for the realization of this electrode is poly-crystalline silicon. The geometrical shape of the electrode is arbitrary, although in practice rectangular shapes are preferred.

The electrode is contacted at its periphery with two or more contacts that are connected to static and switchable voltage sources. When the semiconductor material is kept at ground potential and the contact voltages are positive, the silicon-insulator interface is kept in inversion, so that the photogenerated electrons can be collected and transported there.

Figure 1:
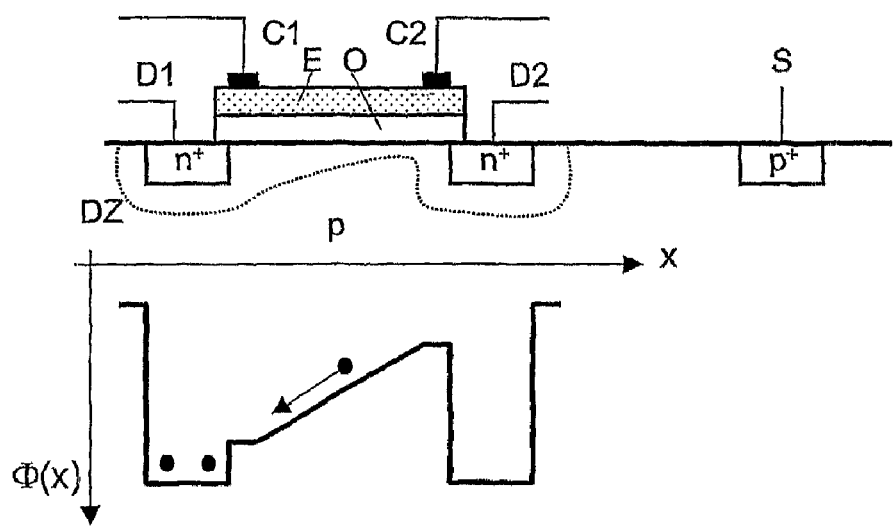
FIG. 1 shows a first embodiment of an image sensor element according to the invention.

Applying different voltages at the resistive electrode's contacts will lead to a two-dimensional distribution of currents and an associated two-dimensional potential distribution that can be calculated according to the laws of electrostatics, as explained in J. D. Jackson, "Classical Electrodynamics", 2nd edition, J. Wiley and Sons, New York, 1975. This non-uniform potential distribution acts across the insulator and creates a corresponding non-uniform potential distribution at the semiconductor-insulator interface. FIG. 1 illustrates this in a simple one-dimensional case, leading to a triangular potential distribution at the interface. Such a non-uniform potential distribution is associated with the presence of an electric field parallel to the semiconductor-insulator interface, given by the negative gradient (or derivative in one dimension) of the potential. Close to each contact at the electrode's periphery a diffusion region of the opposite conductance type to the silicon material is created. Since these diffusions have the task of collecting and accumulating the photocharges, they must be biased to a higher potential than the corresponding electrode contact. FIG. 1 shows a cross section of the demodulation device with two electrode contacts C1 and C2 to the resistive transparent electrode E on top of the transparent insulator (usually an oxide) O. A voltage difference between C1 and C2 results in the lateral triangular shape of the electronic potential distribution (x) at the semiconductor-insulator interface between charge collection diffusions D1 and D2. If the voltage at C1 is higher than at C2, photogenerated electrons are transported by the triangular surface potential to the diffusion D1. The p-type semiconductor is held at ground potential with the substrate contact S. The semiconductor near the surface is depleted, down to the edge of the depletion zone illustrated in FIG. 1 by DZ.

Figure 2:
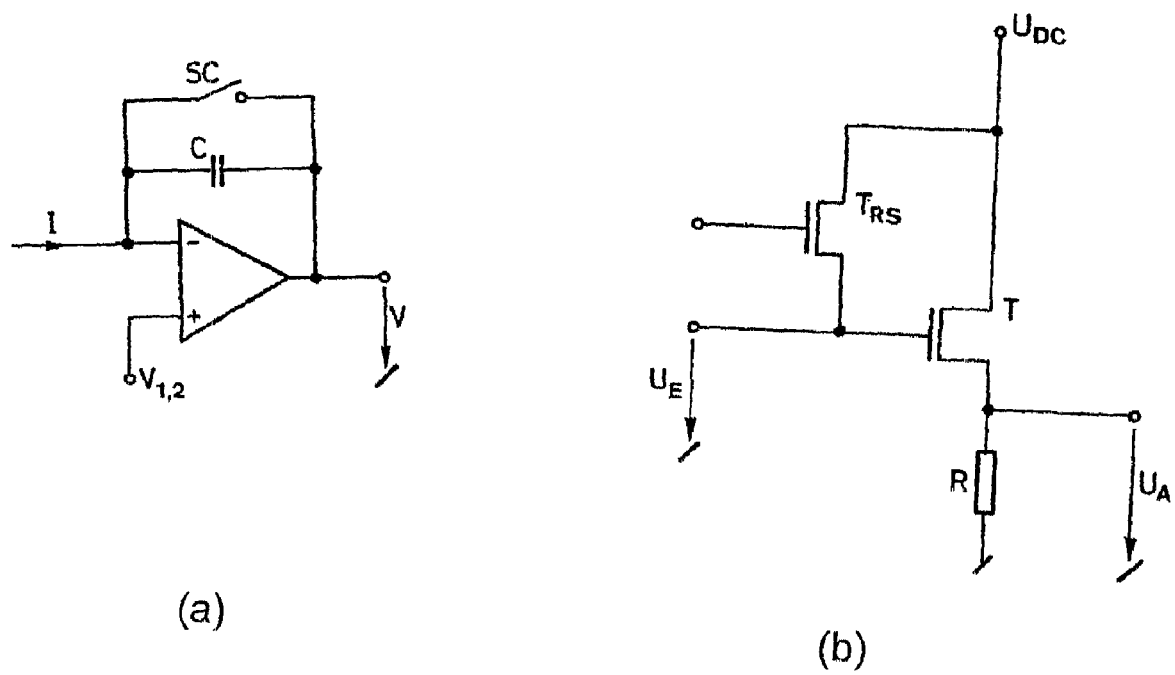
FIG. 2 shows two embodiments of charges integration circuits for reading charge from the sensor elements.

The photocharges on the diffusions can be read out with known electronic circuits such as the charge integration circuit illustrated in FIG. 2a. The charge integration circuit shown in FIG. 2a is based on an operational amplifier with capacitive feedback C, whose positive input terminal is held at the reference potential $V_{1,2}$. The photocurrent I originates from a diffusion of the photosensitive device, and it results in an output voltage V. The integration process can be reset and started from zero by closing the switch SC. FIG. 2b illustrates an alternative in the form of an active pixel sensor circuit. The input terminal $U_E$ is connected to one of the storage diffusions of the photosensitive device. The voltage that is generated by the photocharge on the capacitance of the storage diffusion acts on the base of the source follower transistor T. The charge integration process can be reset to reference voltage $U_{DC}$ with reset transistor $T_{RS}$. The source follower transistor T, whose drain is connected to the supply voltage $U_{DC}$ and whose source is connected to the load resistor R, produces the output voltage $U_A$.

Incident light is transmitted through the transparent electrode and the transparent insulator into the semiconducting material where electron-hole pairs are created near the semiconductor-insulator surface. Electrons diffuse through the semiconducting material until they feel the electric field of the depletion region near the surface, forcing them to move to the semiconductor-insulator interface. At this interface the strong lateral electric field, generated by the overlying resistive electrode, sweeps the electrons in the direction where the potential of the electrode contact is highest. Since the diffusion nearby has even higher potential, the electrons are attracted to this diffusion area where they are stored and accumulated. As a consequence, all photoelectrons under the electrode drift rapidly to this diffusion where they are all collected and stored.

The incident light is temporally modulated with a given frequency f, exhibiting a period T=1/f. For the operation of the demodulation device according to this invention, the period T is divided into two or more time intervals. For each time interval, another voltage configuration at the electrode contacts is generated with a suitable electronic timing circuit, employing for example a field programmable gate array (FPGA). Each voltage configuration has the property that another electrode contact has the highest potential. During this time interval, photogenerated electrons are moved to the corresponding storage diffusion where they are stored and accumulated.

The above described sequence of operations can be repeated for many periods, during a long total exposure time, before the photocharges accumulated in the diffusions are electronically read out. This permits an increase in the number of detected photoelectrons in the diffusion, and an increase in the corresponding signal-to-noise ratio.

The result of the described operation is two or more electrical signal values, one for each storage diffusion, that are available at the end of each total exposure time.

These signal values are then used to calculate the modulation parameters, i.e. to carry out the desired demodulation.

As an example, two signal values S1 and S2, sampled from a modulated wavefield at times that differ by half of the modulation period, allow the calculation of the phase P of a sinusoidally modulated, offset-free incident wavefield by the equation P=arc sin((S1−S2)/(S1+S2)).

As a further example, four signal values S1, S2, S3 and S4, sampled from a modulated wavefield at times that differ by a quarter of the modulation period, allow the calculation of the phase P of a sinusoidally modulated incident wavefield by the equation P=arc tan((S4−S2)/(S1−S3)).

A plurality of the detection and demodulation devices according to the invention can be arranged in one or in two dimensions, resulting in demodulation line sensors or demodulation image sensors. Each of the detection and demodulation devices must be provided with at least the following set of electrical connections:

Power supply voltage and ground

One input voltage line for each of the electrode's contacts that are switched synchronously with the modulation frequency One reset signals for resetting the electronic charge detection circuit after the signals have been read out and a new exposure and charge accumulation period starts One reset reference voltage line, providing the potential value to which the charge storage and accumulation diffusions are discharged during the reset operation.

One pixel selection line that allows the selection of the pixels whose signals should be read out and/or reset.

One output signal for each charge detection circuit that is connected with the corresponding charge storage diffusion. The pixel select line connects the output signals to one or several busses that are common to several pixels, typically to a complete column. Alternatively fewer bus lines than diffusion signals may be provided; in this case a demultiplexing circuit can distribute these signals on the available busses. This makes it necessary to provide each pixel with the appropriate lines for controlling the demultiplexing circuit.

It is possible to displace the position of the transport region, in which the photoelectrons are transported laterally to the respective charge storage and accumulation diffusions, from the semiconductor-insulator interface into the bulk of the semiconductor. The method is known from buried channel CCDs, and it is described in A. J. P. Theuwissen in "Solid-state imaging with charge-coupled devices", Kluwer, Dordrecht, 1995. This is achieved by fabricating an area of the opposite doping type of the semiconductor at the surface and by completely depleting this area with a suitable voltage. In this way, the transported charge carriers are majority charge carriers but since they move in the bulk of a completely depleted semiconductor, they benefit from very efficient transport properties and negligible losses. Typical depth values for this buried transportation channel are between 10 and 1000 nm.

It is also possible to enhance the sensitivity of the detection and demodulation device according to this invention for wavefields consisting of photons with energies close to the band gap of the semiconductor. It is known that photons with such long wavelengths (in the near infrared for silicon) penetrate deeper into the semiconductor, to a depth where no electric field normally reaches. For this reason, photogenerated charge must rely on a thermal diffusion mechanism to reach the surface, where electric fields are available for fast drift transports. The thermal diffusion mechanism is slow, since the transport time depends, on average, on the square of the distance to be traveled. For this reason it is desirable to adapt the demodulation device according to this invention to make is suitable also for application with long-wavelength photons. This is achieved by fabricating an area of the opposite doping type of the semiconductor at the surface and by completely depleting this area with a suitable voltage. In this way, the transported charge carriers are majority charge carriers but since they move in the bulk of a completely depleted semiconductor, they benefit from very efficient transport properties and negligible losses, as described above, following the principles known from buried channel CCDs. The complete circuits for controlling and reading out the pixel signals are also fabricated in such areas of opposite doping type. All of these areas are electrically connected to ground potential. The semiconductor substrate is biased to a highly negative voltage of several tens of Volts in the case of a p-type substrate. In this way, the depletion region in the semiconductor substrate extends deeply into the semiconductor bulk, to depths of several tens of micrometers. In this mode, called "deep depletion", vertical electric fields extend deeply into the semiconductor, leading to fast and efficient drift transport of photogenerated charges also for longer wavelengths of the incident photons.

If a sinusoidally modulated wavefield is not overlaid by a signal of constant value, i.e. if the wavefield is offset-free, then it is sufficient for the extraction of the modulation amplitude and the phase delay to measure two signals per demodulation device. Such a demodulation pixel is preferably realized as a rectangular electrode with two contacts and two corresponding charge storage and accumulation diffusions on opposite sides or corners of the electrode. A cross section of such a two-tap device is shown in FIG. 1.

Figure 3:
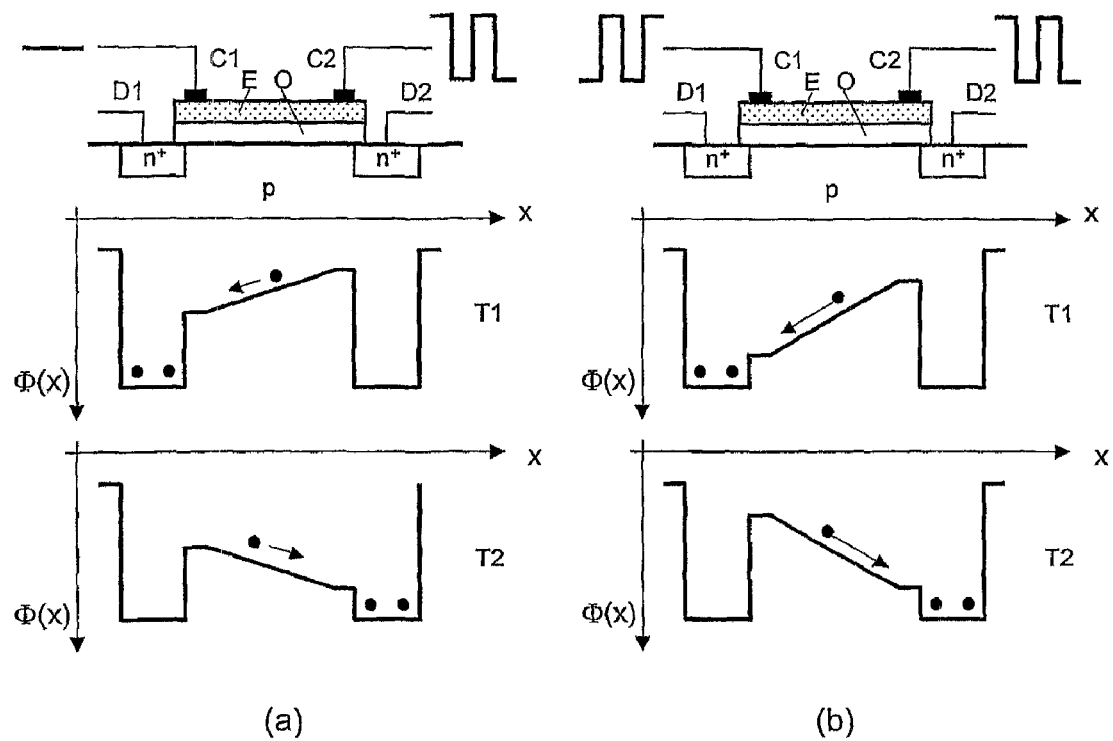
FIG. 3 illustrates the operation of the image sensor element of FIG. 1 when supplied with a clock signal and when supplied with two anti-phase clock signals.

This device can be operated either with one or with two clock signals. The simpler way of operating this device with one clock signal only is illustrated in FIG. 3a. One contact, for example C1, is kept at a constant intermediate voltage level, while the other contact C2 is connected to a clock signal that switches between a high and a low voltage level. During the first half T1 of the clock period the photoelectrons move to the left charge storage and accumulation diffusion D1, during the second half T2 of the clock period the photoelectrons move to the right charge storage and accumulation diffusion D2.

The device can also be operated with two counter-phase clock signals as illustrated in FIG. 2b. The contacts C1 and C2 are connected to two separate clock signals that switch between a high and a low voltage level. To provide for the necessary lateral field in the device, the clock signals must be selected so that one clock signal is at its high voltage level, while the other is at its low voltage level. The two clock signals that are in opposite phase generate an electrical field that is twice as large as in case of only one clock signal, so that the charge carriers are moved with double the speed to the respective charge storage and accumulation diffusions D1 and D2.

Figure 4:
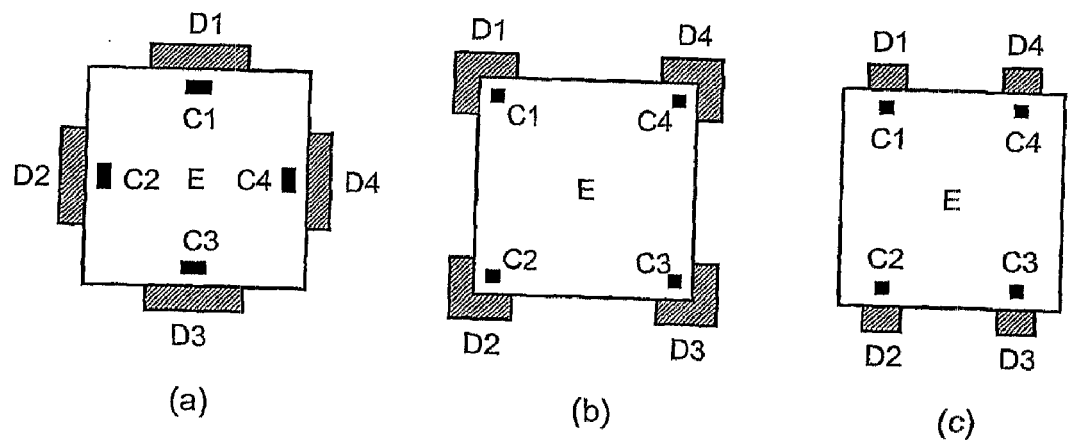
FIG. 4 shows a second embodiment of an image sensor element according to the invention comprising modifications of the element shown in FIG. 1 with different electrode contact arrangements.

In the general case, a sinusoidally modulated wavefield is characterized at each position with three values: the modulation amplitude, the phase delay and the offset value. For this reason, the detection and demodulation pixel for such a general modulated wavefield requires at least three contacts on the electrode, three corresponding charge storage and accumulation diffusions and three clock signals that change three times per period of the modulation frequency. If four instead of three signals are employed, then the demodulation equations are particularly simple, and for this reason, a four-tap device according to this invention represents a preferred embodiment. Three examples of such four-tap pixels are shown in FIG. 4, illustrating the possibilities for fabricating the contacts either as squares of minimum size or as elongated structures, fabricating the diffusions on the four sides of a rectangular electrode, fabricating the diffusions at the corners of a rectangular electrode, and fabricating several diffusions on the same side of an electrode. The electrode shape can be arbitrary but for practical reasons rectangular shapes are preferred in semiconductor technology. FIG. 4 shows preferred embodiments of the demodulation device with four electrode contacts C1, C2, C3 and C4 on the electrode E and corresponding storage diffusions D1, D2, D3 and D4 (top view). FIG. 4a shows storage diffusions situated at the four sides of the rectangular electrode E, FIG. 4b shows storage diffusions situated at the corners of the rectangular electrode E, and FIG. 4c shows storage diffusions situated two each on two sides of the rectangular electrode A preferred implementation of the voltage signals that create the lateral drift fields in a four-tap demodulation pixel is illustrated in the following table.

|    | V1 | V2 | V3 | V4 |
|----|----|----|----|----|
| T0 | H  | I  | L  | I  |
| T1 | I  | H  | I  | L  |
| T2 | L  | I  | H  | I  |
| T3 | I  | L  | I  | H  |

During the four times T0, T1, T2, and T3, each lasting a quarter of the total period T of one charge collection and accumulation sequence, a different voltage pattern V1, V2, V3, and V4 is applied to the four contacts C1, C2, C3 and C4. In the table H represents a high voltage level, L represents a low voltage level and I represents an intermediate voltage level between H and L. The contact whose corresponding diffusion should collect the electrons during a certain time receives the highest voltage. The contact that is opposite the collection contact receives the lowest voltage. The other two contacts receive an intermediate voltage that is typically halfway between the two extreme voltages. In this way, maximum lateral electric fields are created beneath the electrode. The voltage signals that are applied to the contacts have the same period as the modulation frequency, and each voltage signal is just a phase-delayed copy of a master signal. It is not even necessary that these signals are step functions, it is also possible that all contact signals are sinusoids with a phase delay of a quarter of the period between each contact.

The general detection and demodulation device according to this invention consists of one or more electrodes, each with two or more contacts and the same number of corresponding diffusions. In the case of one electrode with n contacts and n corresponding diffusions (an n-tap demodulation pixel), it is possible to detect and demodulate incident modulated wavefields whose modulation waveform is described with n parameters. An example of such a demodulation is a waveform that is a linear combination of n/2 sine signals each with its proper amplitude and n/2 cosine signals each with its proper amplitude. An n-tap demodulation pixel collects all the signals that are necessary for a demodulation operation that is mathematically carried out by a discrete Fourier transform, as explained for example in D. W. Kammler, "A First Course in Fourier Analysis", Prentice Hall, New Jersey, 2000.

Figure 5:
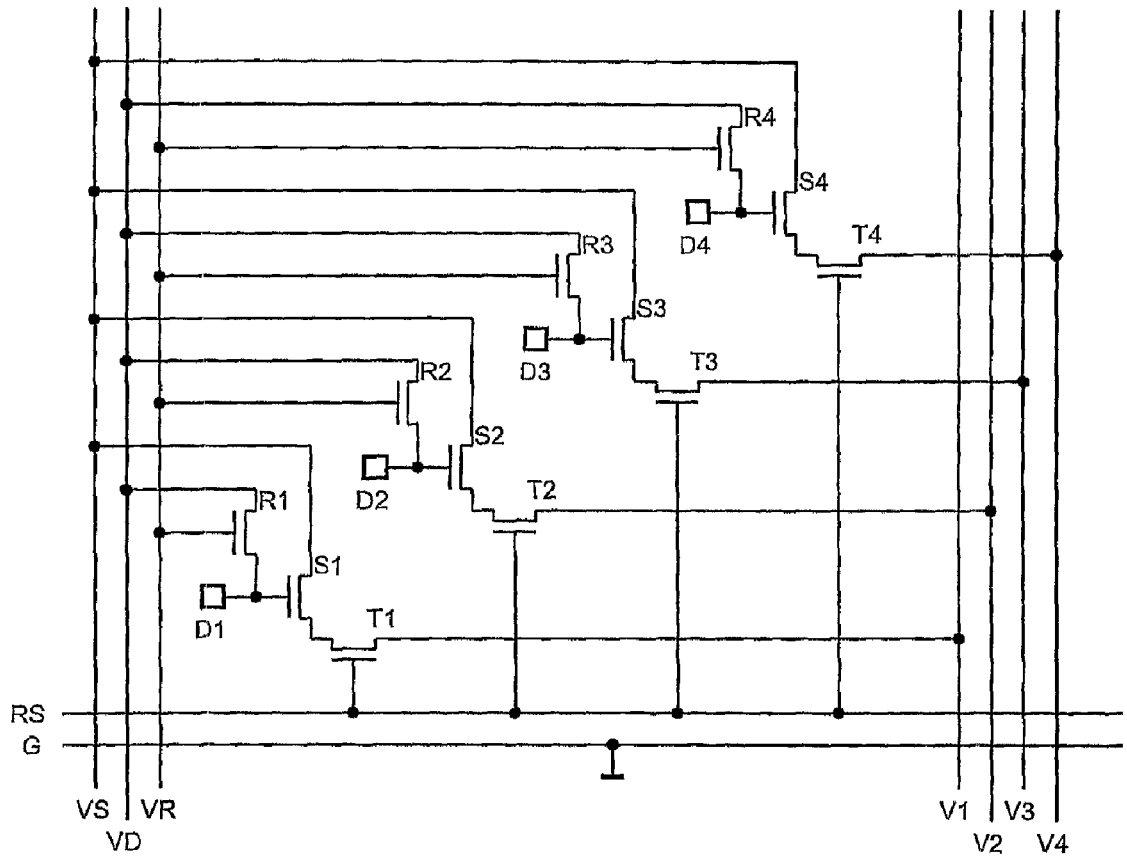
FIG. 5 shows an embodiment of a four tap demodulation image sensor according to the invention.

A preferred embodiment of a complete 4-tap demodulation image sensor is illustrated in FIG. 5. The elementary picture element (pixel) is shown in FIG. 5. Each of the sensing element's storage diffusions D1 . . . D4 is connected to the gate of a source follower transistor S1 . . . S4, whose drain is kept at the supply voltage VS. The diffusions can be reset to the reference potential VD with the reset transistors R1 . . . R4, employing the reset signal line VR. The source follower transistors are connected with row select transistors T1 . . . T4 to the bus lines V1 . . . V4 that are common to all pixels in a column. The row select transistors pass the signals from the source follower transistors to the bus lines under control of the row select signal line RS. In order to provide a proper electrical ground potential to each pixel, a ground line G common to all pixels is employed.

Figure 6:
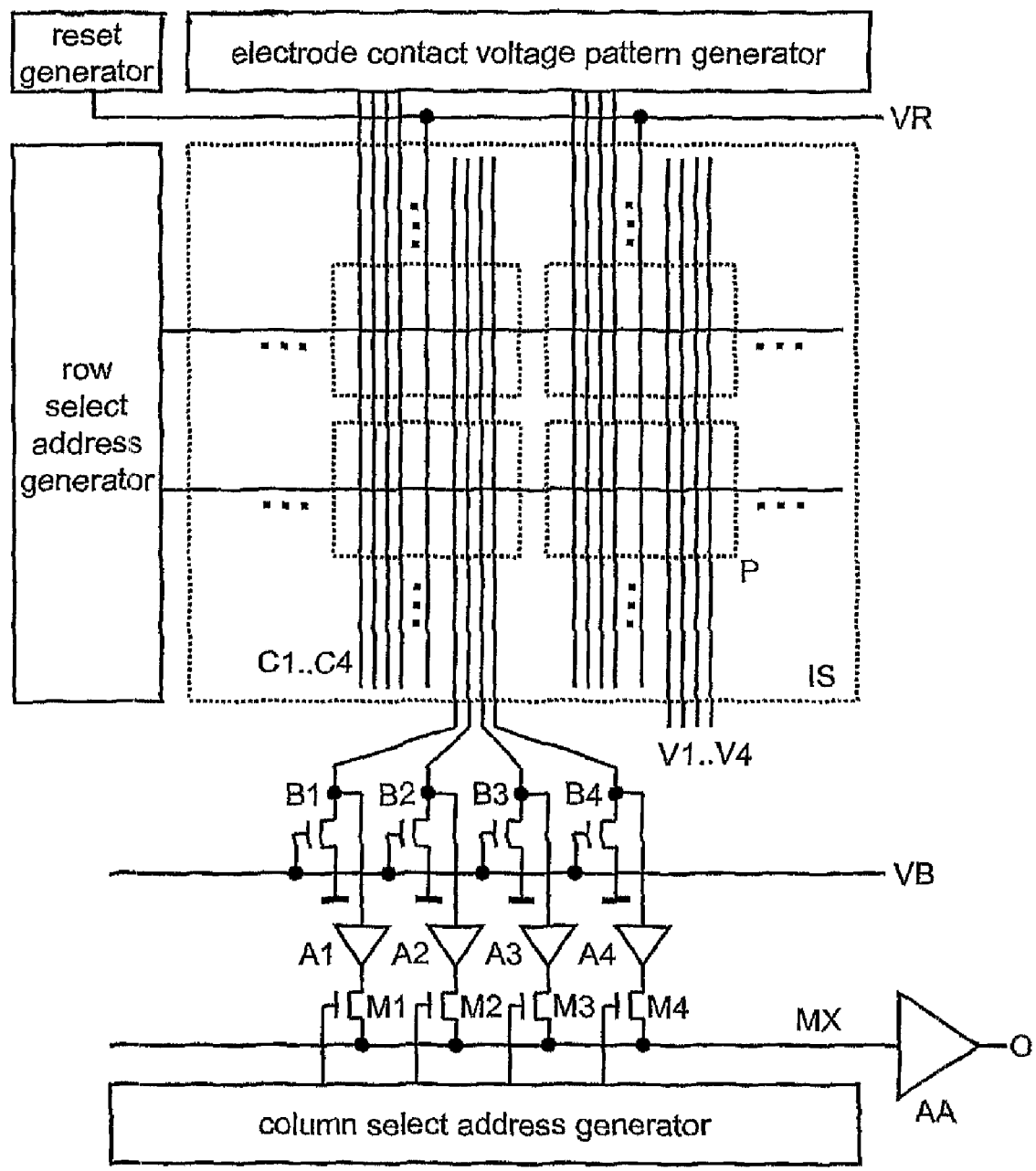
FIG. 6 shows the image sensing part of a device according to the invention for the detection and demodulation of a modulated wavefield.

FIG. 6 illustrates how these elementary pixels P are arranged in two-dimensional fashion in the active image sensing part IS of a complete demodulation image sensor. The row select signal for each row of pixels is provided by a row select address generator. The reset voltage VR for all pixels is provided by a reset signal generator. The four electrode contacts of each pixel obtain their signals from the vertical contact signal lines C1 . . . C4, which are driven by an electrode contact voltage pattern generator. All pixels in a row, whose address has been selected by the row select address generator, supply the output signals of their diffusion source followers to the vertical signal lines V1 . . . V4. Each vertical signal line V1 . . . V4 is terminated with an active load transistor B1 . . . B4, whose gate is kept at the common bias voltage VB. The voltage signals of the vertical signal lines V1 . . . V4 are amplified by the column amplifiers A1 . . . A4. These amplifiers feed their signals through a multiplexing transistor M1 . . . M4 into a common multiplexed readout line MX. The multiplexing transistors M1 . . . M4 are switched on or off by a column select address generator. The signal on the line MX is amplified by the amplifier AA and is delivered to the output line O.

The present invention can be employed, for example, for the optical measurement of the three-dimensional shape of an object according to the time-of-flight ranging technique, as described in R. Lange and P. Seitz, "Solid-State Time-of-Flight Range Camera", IEEE J. Quantum Electronics, Vol. 37 (3), 390-397, 1 Mar. 2001, the contents of which is hereby incorporated by reference. An object is illuminated with a modulated source of light, and the reflected light is imaged with an optical imaging lens on a two-dimensional detection and demodulation device according to this invention. The reflected light forms a two-dimensional intensity modulated wavefield, whose local phase delay carries the information about the local distance of the object to the detection and demodulation device, since light travels at a finite speed through air of about $c=3 \cdot 10^8$ m/s. The present invention allows the measurement of all modulation parameters of the incident modulated wavefield, in particular the local phase delay t. With this measurement, the local distance L to the object, and thereby also its three-dimensional shape, is determined according to the equation $L=ct/2$.

Features of various embodiments of the invention are set forth in the following numbered paragraphs.

1. Device for the detection and demodulation of a modulated wavefield with the following properties:

An image sensor that consists of a one- or two-dimensional arrangement of sensing elements Each sensing element consists of one or more photosensitive parts that convert incoming photons of the wavefield into charge carriers. Each photosensitive part is provided with an overlaying resistive electrode layer, provided with one or more contacts, with which lateral electric fields are created for the lateral transport of photocharge. A storage element is placed close to each contact, the storage element being protected from the incident wavefield, where photocharge is collected, accumulated and stored.

Each storage element is provided with an electronic readout circuit, through which the stored photocharge signal can be accessed and read out.

Each storage element is provided with a reset switch through which the voltage at the storage element can be reset to a reference voltage. In the case of a readout circuit that measures the photocurrent while keeping the storage element at a virtual reference voltage, no such reset switch is required.

An electronic generator that supplies time-dependent voltage patterns to the contacts, in synchronicity with the modulation frequency of the incident wavefield, so that the created photocharge is transported laterally to the corresponding storage elements, where the photocharge is collected and accumulated for one or several periods of the modulation frequency. These accumulated photocharge signals are then read out, and they are used for the calculation of the modulation parameters of the incident modulated wavefield.

An electronic generator that supplies the signals to the sensing elements and their readout circuits that are required for the sequential readout of the photocharge signals.

2. In a device as set forth in paragraph 1, the photosensitive part may be implemented as a piece of semiconducting material, covered by a transparent insulating layer, on top of which a transparent resistive electrode is placed, to which electrical contacts are fabricated in different places, so that current can pass from one contact to another. In the semiconducting material, diffusions are fabricated close to the electrical contact locations, realized as highly doped areas of the opposite conduction type than the semiconducting material.

3. In a device as set forth in paragraph 1 and/or 2, the photosensitive part may be implemented with a semiconducting layer at the surface and of opposite conduction type to the semiconducting substrate material, this surface layer being biased with a voltage so that it is fully depleted.

4. In a device as set forth in paragraph 3, the photosensitive part and all electronic circuits may be implemented in surface semiconducting layers, all of these semiconducting layers being connected to ground potential, while the semiconductor substrate is connected to a voltage that forms a so-called deep depletion layer in the semiconductor substrate. For p-type semiconductor substrate the substrate voltage must be largely negative, for n-type semiconductor substrate the substrate voltage must be largely positive.

5. In a device as set forth in any of paragraphs 1 to 4, the readout electronics may be implemented as a source-follower with pixel-select transistor, as known from active pixel sensor (APS) image sensors.

6. Alternatively, in a device as set forth in any of paragraphs 1 to 4, the readout electronics may be implemented as a resettable charge-amplifier with pixel-select transistor, or as a transconductance amplifier with pixel-select transistor for measuring the photocurrent at the storage element.

7. In a method for the detection and demodulation of modulated wavefields using devices as set forth in any of paragraphs 1 to 6

The wavefield is incident on the detection and demodulation elements, either directly or through optical elements The wavefield creates photocharges in the photosensitive parts of the detection and demodulation elements, whose numbers are dependent on the temporally changing intensity of the wavefield.

Each period of the modulation frequency is separated into temporal intervals, for each of which a separate contact and a storage diffusion are available. During each temporal interval, photogenerated charge is transported to the corresponding storage element, where the photocharge is collected, accumulated and stored. Photocharge transport occurs under the influence of a lateral electrical field that is provided by the voltages at the contacts and the thereby produced currents in a resistive electrode layer. These voltages may be generated by a voltage generator that functions synchronously with the modulation frequency. The voltages are generated such that the electrode, into whose corresponding storage element photocharge should be transported, is supplied with the most attractive voltage of all electrodes; this voltage is positive for photogenerated electrons, and it is negative for photogenerated holes. Photocharges are transported from the electrodes to the nearby storage elements by biassing the storage elements with an even more attractive bias voltage that may be provided through reset switches that carry out periodic reset and biassing operations.

In a first phase, photocharges are repetitively collected and stored in the corresponding storage elements for one or more periods of the modulation frequency of the incident wavefield.

In a second phase, the stored photocharges are read out sequentially, by employing the electronic readout circuits with which the storage elements are provided. The read out stored charges represent the signals with which the modulation parameters of the incident modulated wavefield can be calculated by an evaluation unit.

8. Using a method as set forth in paragraph 7, the three-dimensional shape of a reflective object may be determined. An object is illuminated with a modulated source of light, and the reflected light is imaged with an optical imaging lens on a two-dimensional detection and demodulation device as set forth in paragraphs 1 to 6. The reflected light forms a two-dimensional intensity modulated wavefield, whose local phase carries the information about the local distance of the object to the detection and demodulation device. This method allows the measurement of all modulation parameters of the incident modulated wavefield, in particular the local phase. With this parameter, the local distance to the object and its three-dimensional shape can be determined.

While this invention has been particularly shown and described with references to preferred embodiments thereof, it will be understood by those skilled in the art that various changes in form and details may be made therein without departing from the scope of the invention encompassed by the appended claims.

What is claimed is:

1. A light sensor element comprising:
a semiconductor substrate,
a radiation transparent insulating layer formed on the semiconductor substrate,
an electrode formed as a layer of transparent resistive material on the insulating layer, the transparent resistive material extending across a photosensitive part of the image sensor element in which modulated incident light is converted into photogenerated charges,
a first contact adjacent to a first edge of the resistive layer,
a first diffusion region in the semiconductor substrate of opposite conductivity to the semiconductor substrate located adjacent to the first contact and biased to a higher potential than that of the first contact,
a second contact adjacent to a second edge, opposite the first edge, of the resistive layer,
a second diffusion region in the semiconductor substrate of opposite conductivity to the semiconductor substrate located adjacent to the second contact and biased to a higher potential than that of the second contact,
a signal generator, connected to the first contact and the second contact, supplying time-dependent voltage patterns in synchronism with a modulation of the modulated incident light that generate a current through the transparent resistive material to generate a two dimensional potential distribution in the semiconductor substrate to transport the photogenerated charges alternately to the first diffusion region and the second diffusion region synchronously with the modulation of the modulated incident light.

2. The sensor element as claimed in claim 1, in which the insulating layer is between 1 nanometer (nm) and 1 micrometer (μm) thick.

3. The sensor element as claimed in claim 1, in which the electrode has a sheet resistivity of greater than 10 Ohms (Ω)/square.

4. The sensor element as claimed in claim 1, in which the photosensitive part of the element is implemented in a semiconducting layer at the surface of the substrate, the surface semiconducting layer being of opposite conductivity to the substrate and being biased at the surface semiconducting layer to be fully depleted.

5. The sensor element as claimed in claim 1, further comprising a readout that detects the charge on the diffusion region.

6. The image sensor element as claimed in claim 1, further comprising a readout that detects the charge on the diffusion region of each element.

7. An image sensor comprising a two dimensional array of sensor elements formed in a semiconductor substrate, each one of the sensor elements comprising:
   a radiation transparent insulating layer formed on the semiconductor substrate,
   an electrode formed as a layer of transparent resistive material on the insulating layer, the transparent resistive material extending across a photosensitive part of the image sensor element in which modulated incident light is converted into photogenerated charges,
   a first contact adjacent to a first edge of the resistive layer,
   a first diffusion region in the semiconductor substrate of opposite conductivity to the semiconductor substrate located adjacent to the first contact and biased to a higher potential than that of the first contact, and
   a second contact adjacent to a second edge, opposite the first edge, of the resistive layer,
   a second diffusion region in the semiconductor substrate of opposite conductivity to the semiconductor substrate located adjacent to the second contact and biased to a higher potential than that of the second contact, the image sensor further comprising:
   a signal generator, connected to the first contact and the second contact of the sensor elements, supplying time-dependent voltage patterns in synchronism with a modulation of the modulated incident light that generate a current through the transparent resistive material to generate a two dimensional potential distribution in the semiconductor substrate to transport the photogenerated charges alternately to the first diffusion region and the second diffusion region synchronously with the modulation of the modulated incident light.

8. The image sensor element as claimed in claim 7, in which the insulating layer is between 1 nanometer (nm) and 1 micrometer (μm) thick.

9. The image sensor element as claimed in claim 7, in which the electrode has a sheet resistivity of greater than 10 Ohms (Ω)/square.

10. The image sensor element as claimed in claim 7, in which the photosensitive part of each of the elements is implemented in a semiconducting layer at the surface of the substrate, the surface semiconducting layer being of opposite conductivity to the substrate and being biased at the surface semiconducting layer to be fully depleted.

* * * * *